(12) United States Patent
Plat et al.

(10) Patent No.: US 6,548,423 B1
(45) Date of Patent: Apr. 15, 2003

(54) MULTILAYER ANTI-REFLECTIVE COATING PROCESS FOR INTEGRATED CIRCUIT FABRICATION

(75) Inventors: Marina V. Plat, San Jose, CA (US); Christopher F. Lyons, Fremont, CA (US); Scott A. Bell, San Jose, CA (US); Todd P. Lukanc, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/047,971

(22) Filed: Jan. 16, 2002

(51) Int. Cl.[7] ............... H01L 21/31; H01L 21/469
(52) U.S. Cl. ............... 438/780; 438/725; 438/761
(58) Field of Search ................... 438/725, 738, 438/761, 780; 430/311, 317

(56) References Cited

U.S. PATENT DOCUMENTS

| 5,264,076 | A | 11/1993 | Cuthbert et al. |
| 5,773,199 | A | 6/1998 | Linliu et al. |
| 5,837,428 | A | 11/1998 | Huang et al. |
| 5,858,621 | A | 1/1999 | Yu et al. |
| 6,080,678 | A | 6/2000 | Yim |
| 6,096,659 | A | 8/2000 | Gardner et al. |
| 6,136,679 | A | 10/2000 | Yu et al. |
| 6,156,629 | A | 12/2000 | Tao et al. |
| 6,218,292 | B1 * | 4/2001 | Foote .................. 438/636 |
| 6,221,776 | B1 * | 4/2001 | Smith .................. 438/692 |
| 6,297,170 | B1 * | 10/2001 | Gabriel et al. ........ 438/738 |
| 6,352,922 | B1 * | 3/2002 | Kim .................... 438/648 |
| 6,365,529 | B1 * | 4/2002 | Hussein et al. ........ 438/780 |
| 6,410,421 | B1 * | 6/2002 | Ghandehari et al. .... 438/636 |

\* cited by examiner

Primary Examiner—Alexander Ghyka
(74) Attorney, Agent, or Firm—Foley & Lardner (57) ABSTRACT

A method utilizing a multilayer anti-reflective coating layer structure. The multilayer anti-reflective coating structure can be utilized as a hard mask forming various integrated circuit structures. A multilayer anti-reflective coating structure can be utilized to form gate stacks comprised of polysilicon and a dielectric layer. A photoresist is applied above the multilayer anti-reflective coating.

20 Claims, 10 Drawing Sheets

MULTILAYER ANTI-REFLECTIVE COATING PROCESS FOR INTEGRATED CIRCUIT FABRICATION

FIELD OF THE INVENTION

The present specification relates to the fabrication of integrated circuits (ICs). More specifically, the present specification relates to a hard mask process for forming integrated circuit features.

BACKGROUND OF THE INVENTION

Semiconductor devices or integrated circuits (ICs) can include millions of devices, such as, transistors. Ultra-large scale integrated (ULSI) circuits can include complementary metal oxide semiconductor (CMOS) field effect transistors (FET). Despite the ability of conventional systems and processes to fabricate millions of devices on an IC, there is still a need to decrease the size of IC device features, and, thus, increase the number of devices on an IC.

One limitation to the smallness of IC critical dimensions is conventional lithography. In general, projection lithography refers to processes for pattern transfer between various media. According to conventional projection lithography, a silicon slice, the wafer, is coated uniformly with a radiation-sensitive film or coating, the photoresist. An exposing source of radiation illuminates selected areas of the surface through an intervening master template, the mask, for a particular pattern. The radiation can be light, such as ultra-violet light, vacuum ultra-violet (VUV) light and deep ultraviolet light. The radiation can also be x-ray radiation, e-beam radiation, etc.

The lithographic photoresist coating is generally a radiation-sensitive coating suitable for receiving a projected image of the subject pattern. Once the image is projected, it is indelibly formed in the coating. The projected image may be either a negative or a positive image of the subject pattern.

Exposure of the lithographic coating through a photomask or reticle causes the image area to become selectively either more or less soluble (depending on the negative or positive photoresist coating) in a particular developer. The more soluble areas are removed in the developing process to leave the pattern image in the coating as less soluble polymer.

The photoresist material or layer associated with conventional lithographic technologies is often utilized to selectively form various IC structures, regions, and layers. Generally, the patterned photoresist material can be utilized to define doping regions, implant regions or other structures associated with an integrated circuit (IC). A conventional lithographic system is generally utilized to pattern photoresist material to form gate stacks or structures. As the features in semiconductor patterning become smaller and smaller, the photoresist thickness needed to sustain reasonable aspect ratio must decrease. A thinner photoresist may not be suitable for etch applications due to premature resist erosion. Thus, resist erosion complications facilitate the necessity for hard mask processes.

According to one conventional process, a hard mask is provided above polysilicon/oxide layers to pattern the gate stacks. The hard mask must be thin enough so that it can be etched without eroding the patterned photoresist above it. The hard mask must also be thick enough to withstand an etch process that can completely remove uncovered portions of the polysilicon layer. Accordingly, the hard mask must have a precise thickness to appropriately pattern the gate stacks.

An anti-reflective coating (ARC) has been conventionally provided underneath the photoresist material or the hard mask to reduce reflectivity and thereby, reduce resist notching, lifting and variation of critical dimension of the obtained pattern. Generally, the ARC (organic or inorganic) layer is a relatively thin layer which cannot be used as a hard mask because it is too thin and does not allow thickness flexibility due to optical design parameters.

Thus, there is a need to pattern IC devices using non-conventional lithographic techniques. Further, there is a need for a process of forming a gate stack that does not require a conventional hard mask step. Yet further, there is a need for a double ARC process. Even further still, there is a need for a gate mask process that effectively balances optical and etching efficiencies.

SUMMARY OF THE INVENTION

An exemplary embodiment relates to a method of fabricating an integrated circuit. The method includes providing a first anti-reflective coating layer above substrate providing a second anti-reflective coating layer above the first anti-reflective coating layer, providing a photoresist layer above the second anti-reflective coating layer. The method further includes patterning the photoresist layer and selectively etching/removing the first and the second anti-reflective coating layer in accordance with a feature defined by the photoresist layer. A first thickness of the first anti-reflective coating layer and a second thickness of the second anti-reflective coating layer are configured to reduce reflections associated with the patterning step. Also, the thickness and materials for the two layers can be chosen to be thin enough to be etched without eroding photoresist and thick enough to withstand the etching of layers underneath. The first anti-reflective layer should have substantially different resist/layer etch selectivity as compared to the second layer.

Another exemplary embodiment relates to a method of forming a gate stack for an integrated circuit. The method includes providing a first anti-reflective coating layer and a second anti-reflective coating layer over a gate conductor, providing a photoresist layer over the second anti-reflective coating layer, patterning the photoresist layer to form a first feature in the photoresist layer, and trim etching the photoresist layer to reduce size of the first feature and etching the first ARC layer to form a second feature. The method also includes etching/removing the anti-reflective coating layer in accordance with the second feature, and etching the gate conductor layer in accordance with the first anti-reflective coating layer and the second anti-reflective coating layer.

Yet another exemplary embodiment relates to a method of forming a hard mask for an integrated circuit. The method comprises steps of providing a dual layer anti-reflective coating above a substrate, providing a photoresist layer above the dual layer anti-reflective coating, patterning the photoresist layer to form a feature, trim etching the photoresist layer to reduce size of the resist feature, selectively etching the first ARC layer, removing all remaining photoresist, selectively etching the second ARC layer and the remaining stack material (polygate as an example) in accordance with the feature formed by a dual ARC layer. The patterned dual ARC layer acts as a hard mask.

BRIEF DESCRIPTION OF THE DRAWINGS

The exemplary embodiments will hereafter be described with reference to the accompanying drawings, wherein like numerals denote like elements, and.

DETAILED DESCRIPTION OF THE PREFERRED EMBODIMENTS

Figure 1:
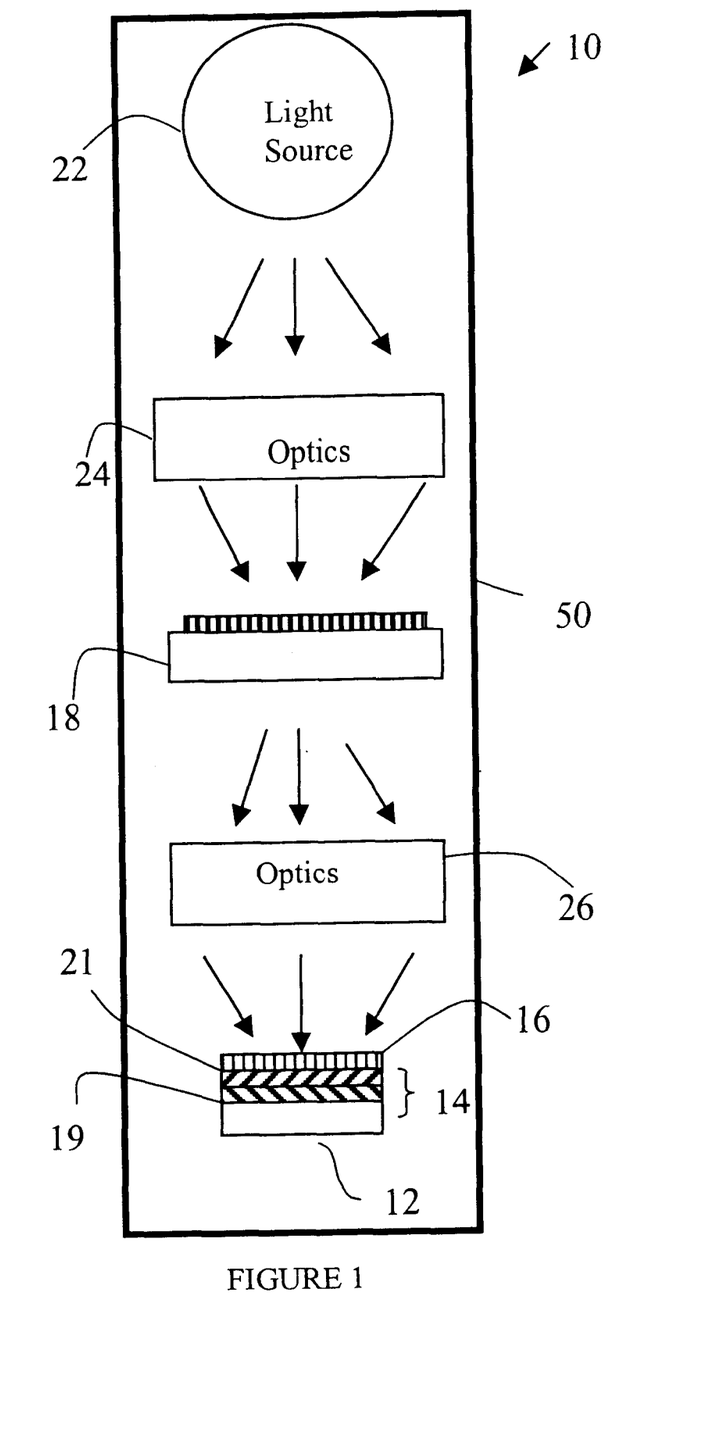
FIG. 1 is a general schematic block diagram of a lithographic system for processing a substrate according to an exemplary embodiment.

Referring to FIG. 1, a substrate 12 is shown in a lithographic system 10. Substrate 12 can be a semiconductor substrate, such as, silicon, gallium arsenide, germanium, or other substrate material. Substrate 12 can include one or more layers of material and/or features, such as, lines, interconnects, vias, doped portions, etc., and can further include devices, such as, transistors, microactuators, microsensors, capacitors, resistors, diodes, etc. Substrate 12 can be an entire IC wafer or part of an IC wafer. Substrate 12 can be part of an integrated circuit, such as, a memory, a processing unit, an input/output device, etc.

Lithographic system 10 provides a pattern of radiation to substrate 12. System 10 can include a chamber 50. Chamber 50 can be a vacuum or low pressure chamber for use in UV, deep UV, or VUV lithography. Chamber 50 can contain any of numerous types atmospheres, such as, nitrogen, etc. Alternatively, lithographic system 10 can be utilized in various other types of lithography including lithography that uses radiation at any number of wavelengths.

Lithographic system 10 includes a light source 22, a condenser lens assembly 24, a reticle or a mask 18, and an objective lens assembly 26. System 10 can include a stage that supports substrate 12 and can move substrate 12 with respect to lens assembly 26. System 10 can have a variety of configurations and arrangements. The configuration of system 10 shown in FIG. 1 is exemplary.

System 10 can include mirrors, beam splitters, and other components arranged according to other designs. System 10 can be embodied as a lithographic camera or stepper unit. An example of lithographic system 10 is a PAS5500/xxx series machine manufactured by ASML. Other examples include Microscan DUV systems by Silicon Valley Group or an XLS family Microlithography System by Integrated Solutions, Inc. of Korea.

Substrate 12 can include one or more layers of material thereon. The layers can be insulative layers, conductive layers, barrier layers, or other layers of material which are to be etched, or selectively removed using the process described herein.

In one embodiment, the layers above substrate 12 are a dielectric layer and a gate conductor layer used to form a gate stack. The dielectric layer can be a gate oxide and the gate conductor layer can be polysilicon or metal. The gate stack is configured using the process described below. Various integrated circuit features may be fabricated using the method described below.

Substrate 12 and subsequent layers of material are not described in a limiting fashion. The principles of the present invention can be applied to any integrated circuit substrate, wafer, mask layer, or other layer. Substrate 12 can be conductive, semiconductive, or insulative.

A layer of lithographic material, such as, a photoresist layer or material 16 is deposited or applied over a multilayer anti-reflective coating structure 14. In one embodiment, multilayer anti-reflective coating structure 14 can be dual layer structure including an anti-reflective coating layer 19 and anti-reflective coating layer 21. Structure 14 preferably serves as a hard mask for subsequent etching of layers above substrate 14 as well as a coating for optically enhancing resolution by reducing reflections. Thickness and materials for layers 19 and 21 are chosen so structure 14 is thin enough to be etched without eroding material 16 and yet thick enough to provide critical dimension control and to withstand the etching of layers underneath structure 14.

Photoresist material 16 can comprise any of a variety of photoresist chemicals suitable for lithographic applications. Material 16 can be comprised of a matrix material or resin, a sensitizer or inhibitor, and a solvent. Photoresist material 16 is preferably a high-contrast photoresist, but may alternatively be a low-contrast photoresist.

Photoresist material 16 is deposited by, for example, spin-coating over layer of structure 14. Material 16 can be provided with a thickness of less than 0.5 microns. Preferably, photoresist material 16 has a thickness between 0.1 and 0.05 microns. Further, photoresist material 16 may be either a positive photoresist or a negative photoresist and can be a multilayer resist material.

With reference to FIGS. 1–10, an exemplary process for forming a gate stack or structure is described below as follows. The process advantageously provides a hard mask with good critical dimension control and anti-reflective coating characteristics.

Figure 2:
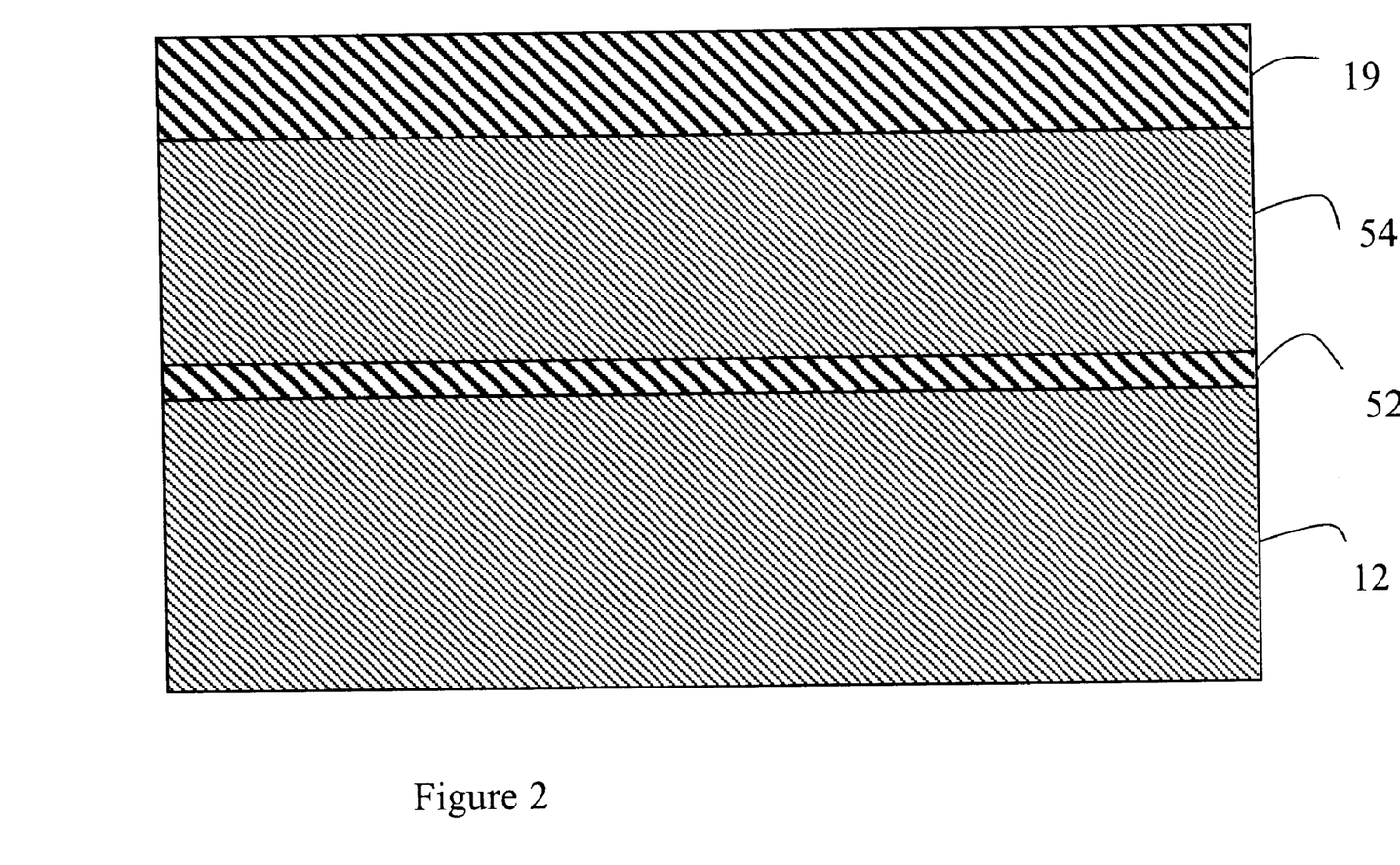
FIG. 2 is a schematic cross-sectional view of the substrate illustrated in FIG. 1, showing a first anti-reflective coating deposition step in accordance with an exemplary embodiment.

With reference to FIG. 2, substrate 12 includes a dielectric layer 52 and a gate conductor layer 54. Layers 52 and 54 are a conductive/dielectric stack for the formation of a gate structure. Layers 52 and 54 can have a variety of thicknesses and be manufactured from a variety of materials. In one embodiment, gate conductor layer 54 is a 500–2000 Å thick polysilicon layer and layer 52 is a 5–20 Å thick silicon dioxide or silicon nitride layer. Layer 54 can be deposited by chemical vapor deposition (CVD) above layer 52. Layer 52 can be grown or deposited (CVD) above substrate 12.

An anti-reflective coating layer 19 is provided above layer 54. Anti-reflective coating layer 19 can be deposited by CVD. In one embodiment, layer 19 is deposited as a 100–1000 Å thick layer of organic ARC. Alternative materials and thickness for layers 19 and 21 include a combination of 100–1000 Å of CVD organic carbon and 100–1000 Å of CVD silicon nitride film.

Figure 3:
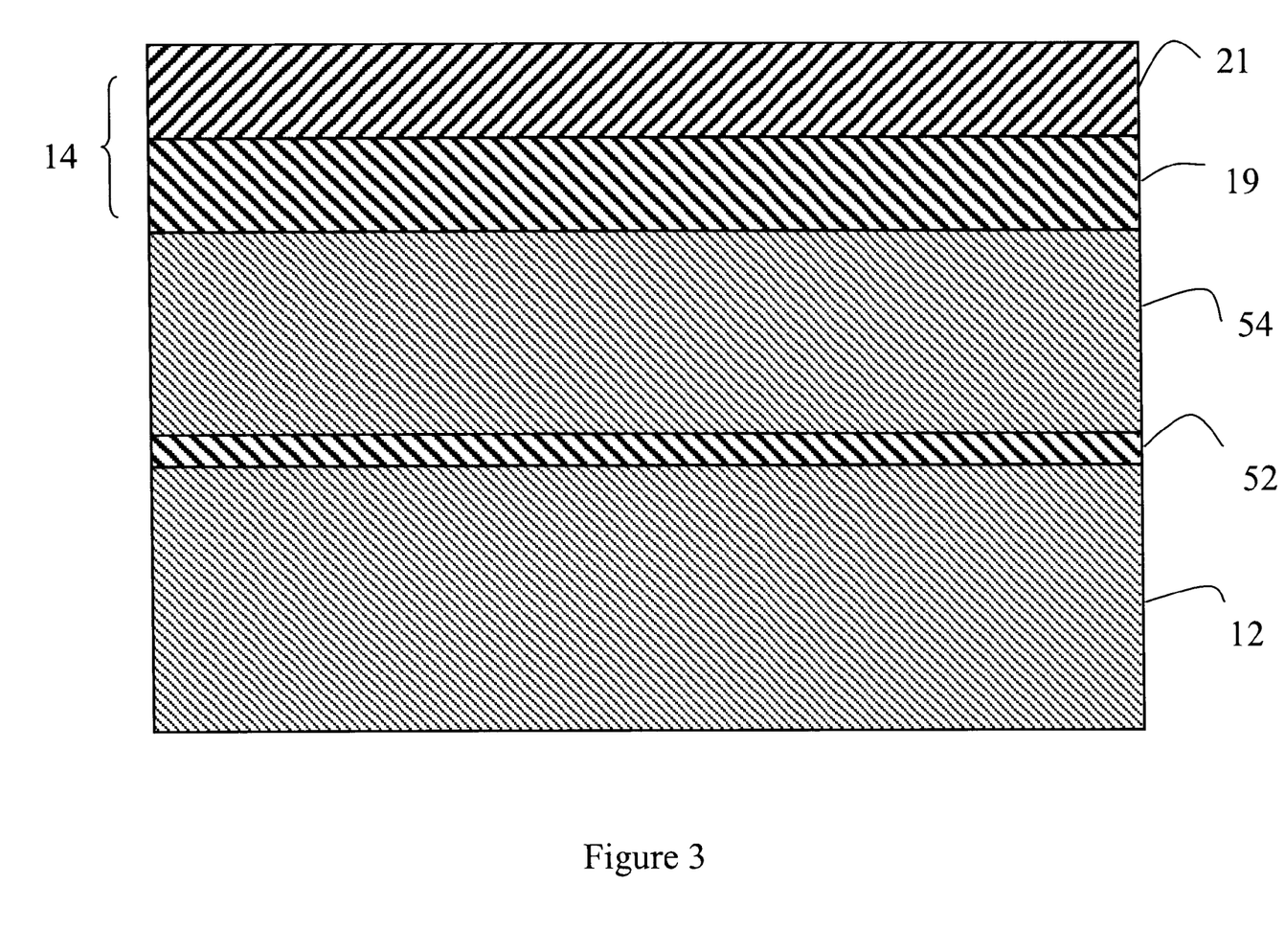
FIG. 3 is a schematic cross-sectional view of the substrate illustrated in FIG. 2, showing a second anti-reflective coating layer deposition step in accordance with an exemplary embodiment.

With reference to FIG. 3, an anti-reflective coating layer 21 is deposited above anti-reflective coating layer 19. Layer 21 can be deposited by CVD. The combination of layers 19 and 21 forms a multilayer or bi-layer ARC that also can be used as a hard mask for selectively removing layers 52 and 54 to form gate stacks. In one embodiment, layer 21 is a 100–1000 Å thick layer of silicon rich nitride (SIRN). Alternative materials and thicknesses for layer 21 include silicon oxynitride (SION).

The thickness of layers 19 and 21 are chosen in accordance with optical parameters associated with system 10. Preferably, the thickness of layers 19 and 21 are chosen so that the combination of layers 19 and 21 has an anti-reflective effect and yet have a thickness requirement suitable for use as a hard mask. In a preferred embodiment, the thickness is chosen to be thick enough to avoid erosion when layer 54 is etched and yet thin enough so that photoresist material is not eroded when layers 19 and 21 are etched. In one embodiment, layer 19 is CVD carbon and layer 21 is silicon rich nitride.

System parameters and design considerations can affect the selection of dimensions and materials for layers 19 and 21. For example, the wavelength of radiation used by system 10 (FIG. 1) can affect the selection of materials and thicknesses for layers 19 and 21. In one embodiment, system 10 uses radiation having a wavelength of 248 nm, layer 19 is a 400 Å thick layer of organic CVD ARC and layer 21 is a 200 Å thick layer of Si rich nitride. Layers 19 and 21 can be the same material as each other or different materials from each other.

Figure 4:
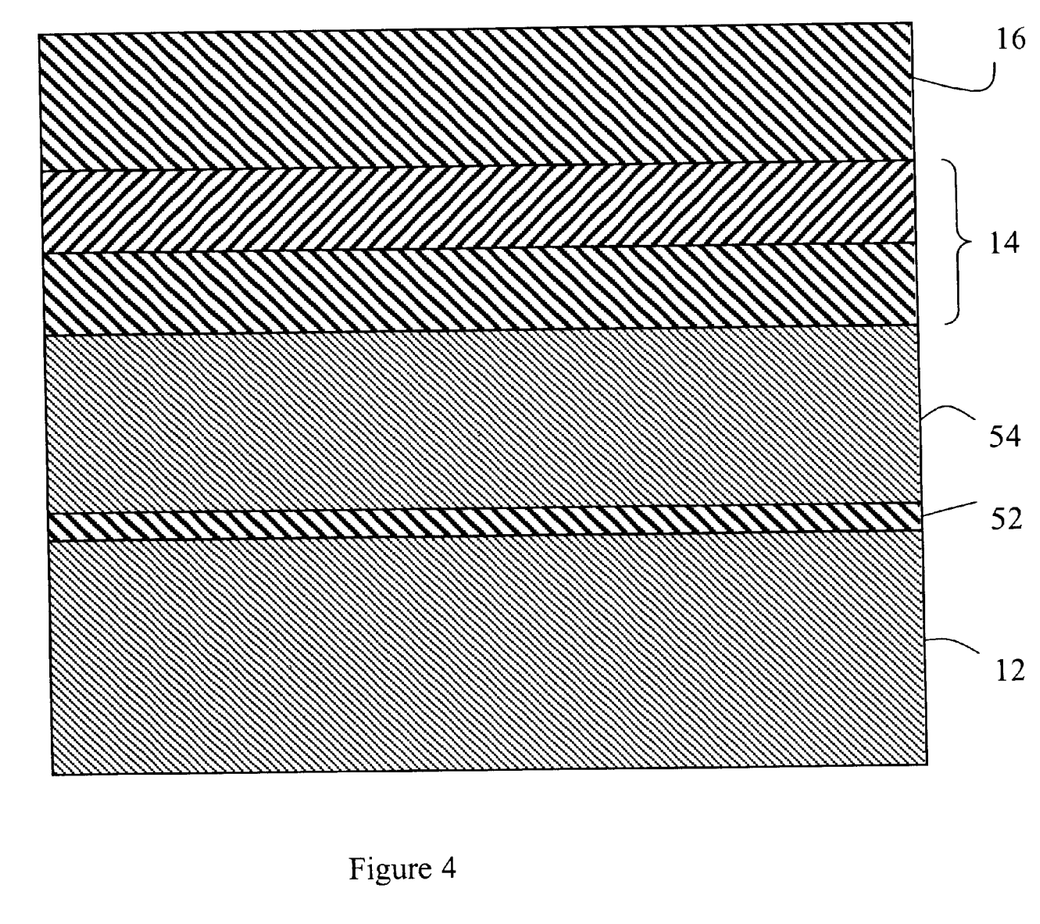
FIG. 4 is a schematic cross-sectional view of the substrate illustrated in FIG. 3, showing a photoresist layer application step in accordance with an exemplary embodiment.

With reference to FIG. 4, a layer of photoresist material 16 is applied above multilayer structure 14. Material 16 can be applied by spin coating to a thickness of 100–50000 Å.

Figure 5:
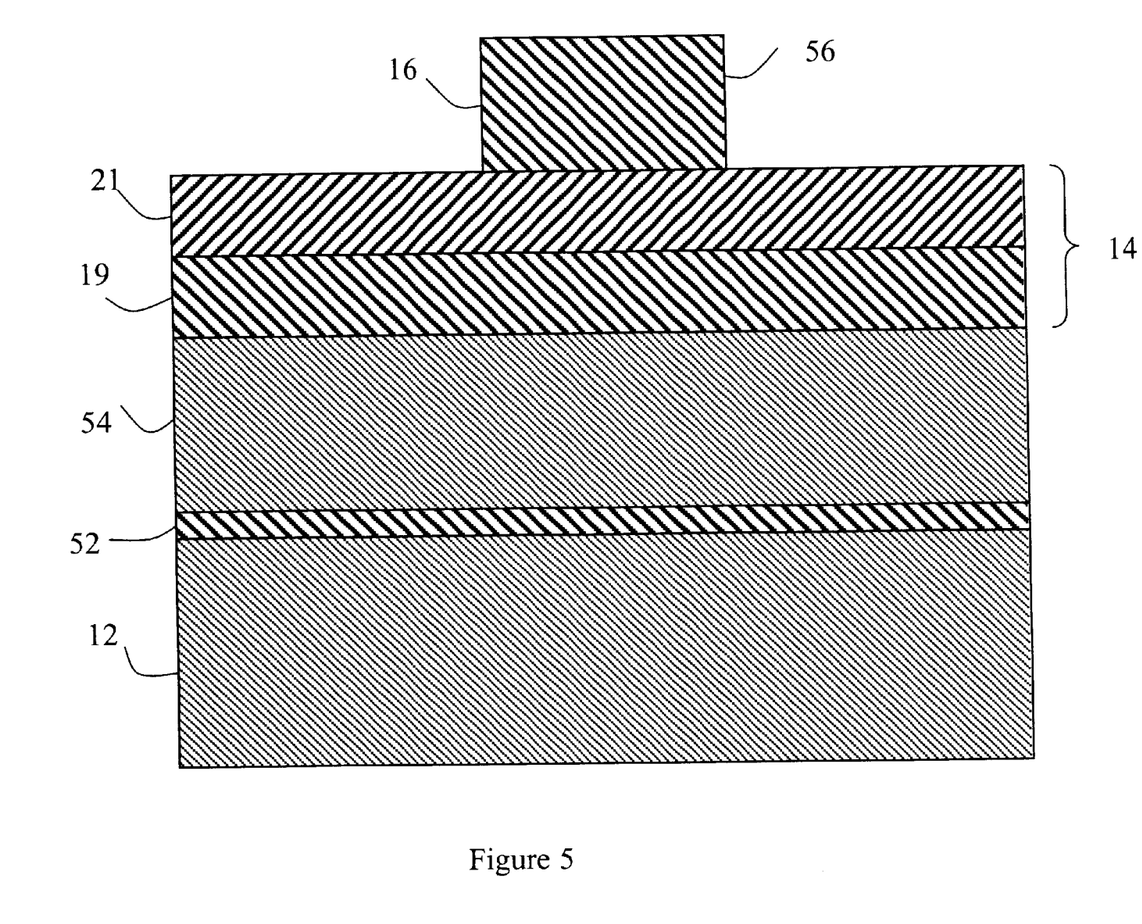
FIG. 5 is a schematic cross-sectional view of the substrate illustrated in FIG. 4, showing a photoresist patterning step in accordance with an exemplary embodiment.

With reference to FIG. 5, photoresist material 16 is configured to have a feature 56 according to a conventional lithographic process in a system, such as, system 10. The lithographic process advantageously utilizes the anti-reflective characteristics of structure 14.

In one embodiment reticle 18 (FIG. 1) is utilized to pattern feature 56 in material 16. After exposure to radiation in system 10, material 16 is developed to leave feature 56.

Figure 6:
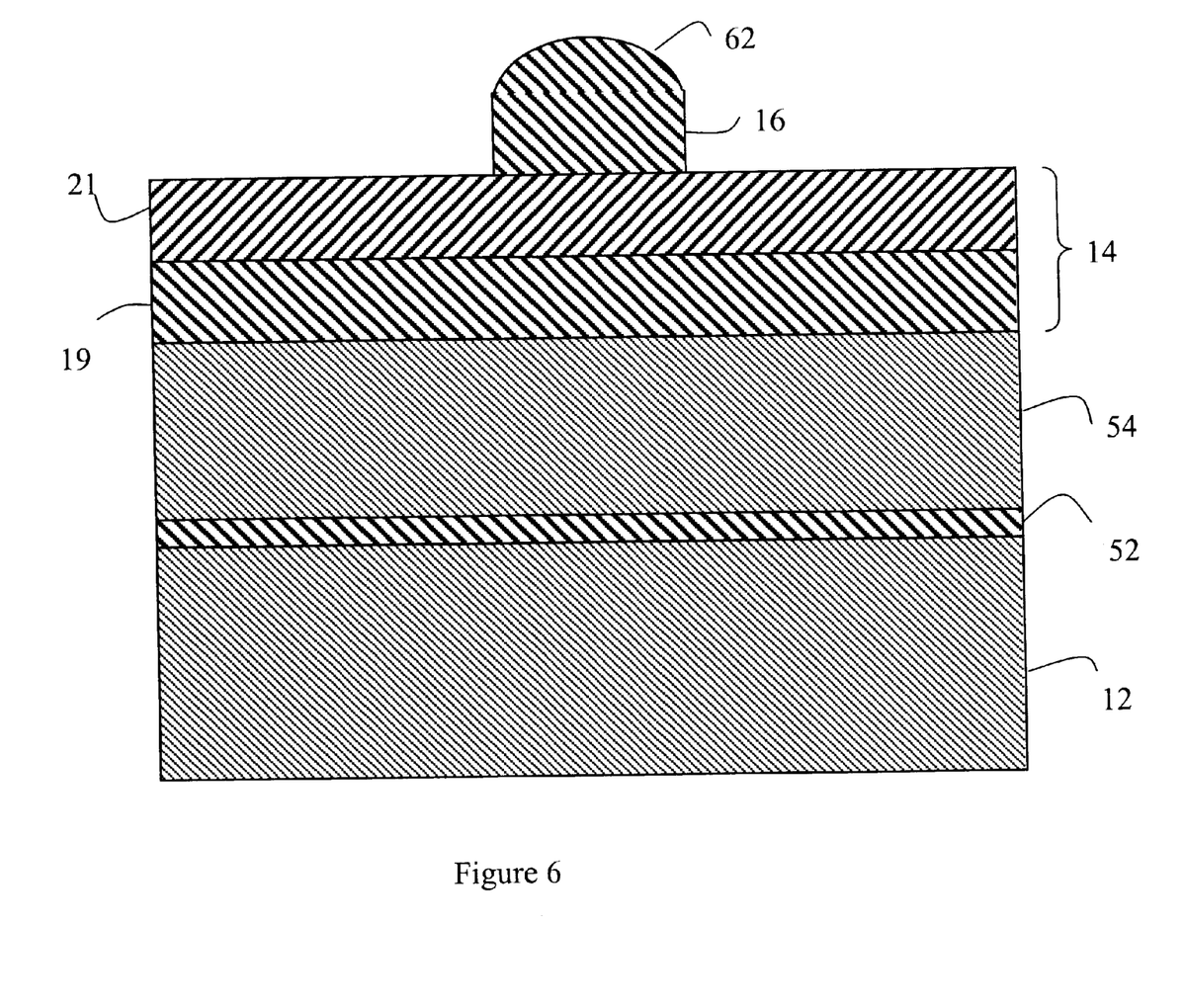
FIG. 6 is a schematic cross-sectional view of the substrate illustrated in FIG. 5, showing a trim etching step in accordance with an exemplary embodiment.

With reference to FIG. 6, material 16 is subjected to a trim etching process to reduce its dimension. After the trim etching process, material 16 includes a feature 62. Feature 62 has a width less than the width of feature 56 (FIG. 5).

Figure 7:
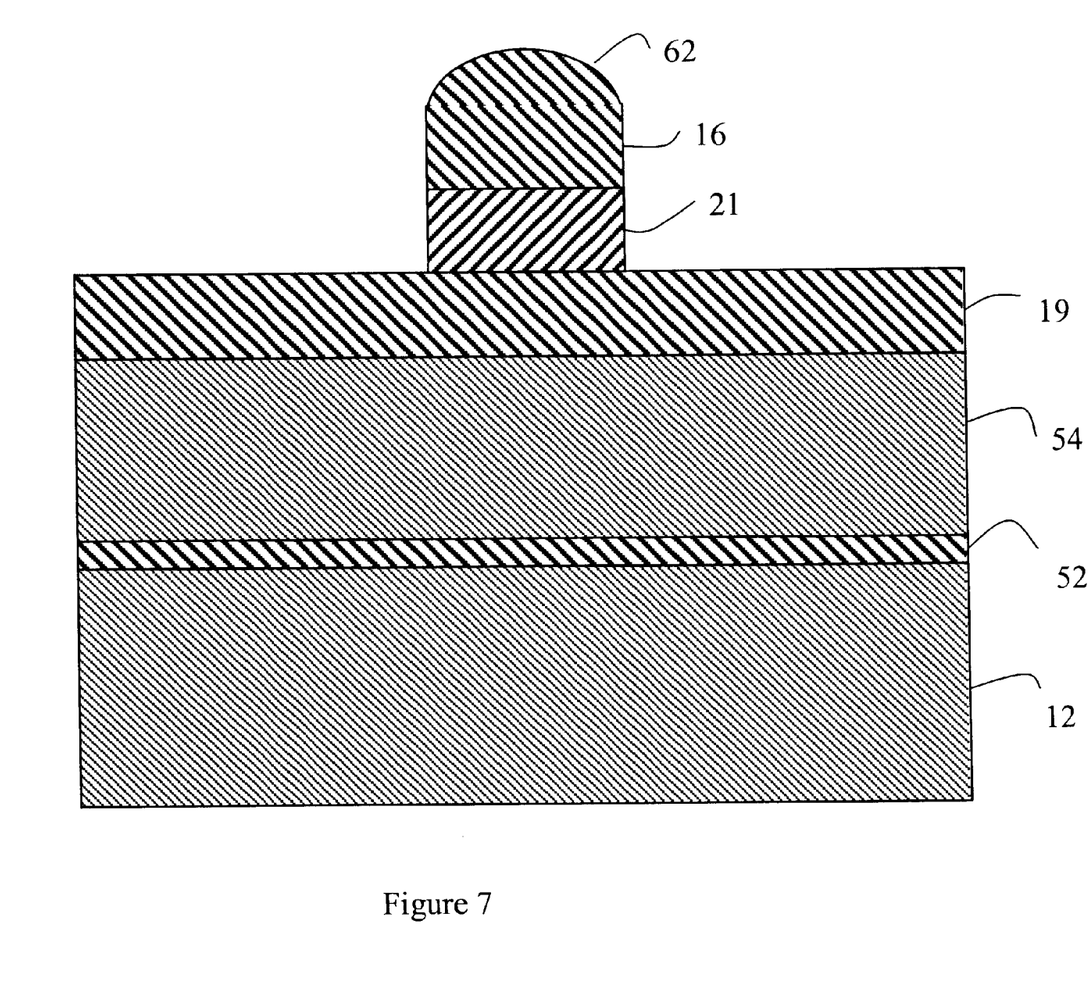
FIG. 7 is a schematic cross-sectional view of the substrate illustrated in FIG. 6, showing a first anti-reflective coating layer etching step in accordance with an exemplary embodiment.

With reference to FIG. 7, layer 21 is removed in accordance with feature 16. Preferably, a dielectric etching process is utilized to remove layer 21. The etching process can be selective to material 21 with respect to material 16. If materials associated with layers 19 and 21 have different etch selectivity, material 16 can be removed after layer 21 is etched. Alternatively, if layers 19 and 21 have similar etch selectivity, material 16 is not removed until after layer 19 is etched.

Figure 8:
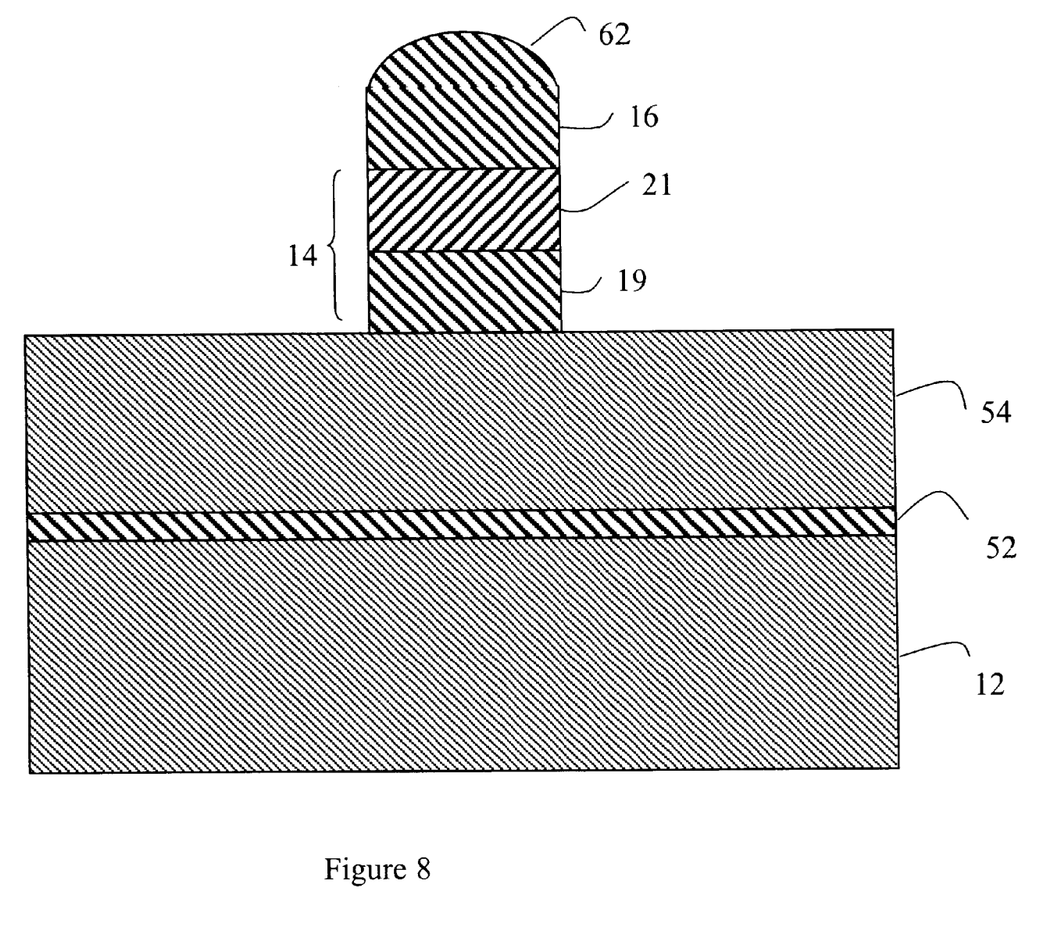
FIG. 8 is a schematic cross-sectional view of the substrate illustrated in FIG. 7, showing a second anti-reflective coating layer etching step in accordance with an exemplary embodiment.

With reference to FIG. 8, layer 19 is etched in accordance with feature 16. Layer 19 can be etched in a process similar to the process used to etch layer 21. In one embodiment, layers 19 and 21 can be simultaneously etched. Preferably, layer 19 is etched in a process selective to the material of layer 19 with respect to gate conductor layer 54.

Figure 9:
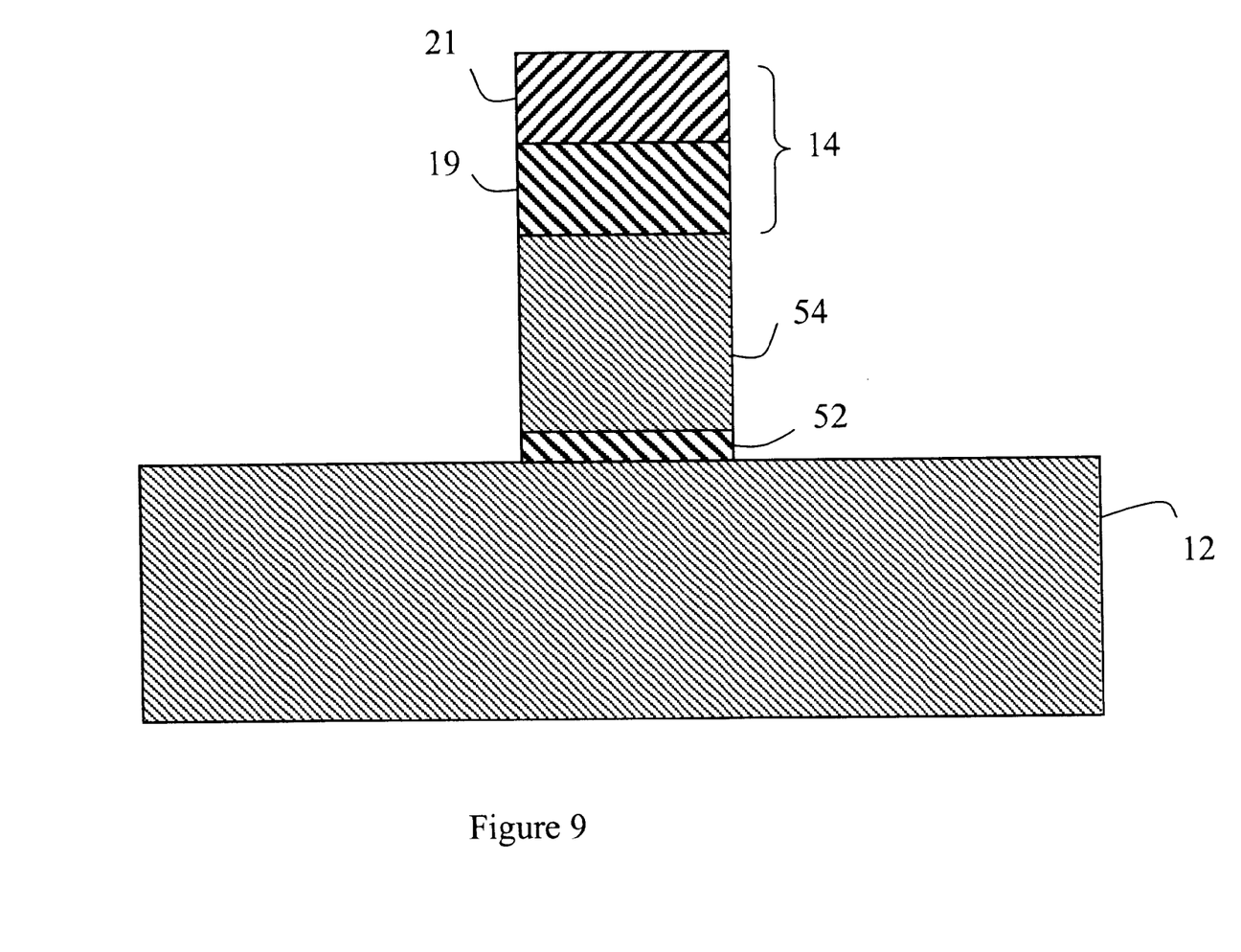
FIG. 9 is a schematic cross-sectional view of the substrate illustrated in FIG. 8, showing a gate stack etching step in accordance with an exemplary embodiment.

With reference to FIG. 9, material 16 (FIG. 8) is removed and gate conductor layer 54 and dielectric layer 52 are etched. Alternatively, photoresist layer 16 can remain during the etching of layers 54 and 52.

Gate conductor layer 54 can be etched in a dry etching process selective to layer 54 with respect to layer 19 and layer 21. After layer 54 is etched, layer 52 can be etched in a dry etching process selective to layer 52 with respect to layers 21 and 19.

Material 16 can be removed in an ashing process. For example, a conventional ashing process utilizing an $O_2$ plasma can remove material 16. Alternatively, other removal processes such as wet strip can strip material 16. Gate conductor layer 54 and dielectric layer 52 are etched utilizing structure 14 as a hard mask.

Various design criteria can be utilized for layers 19 and 21. For example, a designer can chose the required total thickness of structure 14 to appropriately etch layers 54 and 52. Knowing the optical characteristics of materials for layers 19 and 21, the thickness of layers 19 and 21 can be chosen to achieve the desired optical characteristics.

Figure 10:
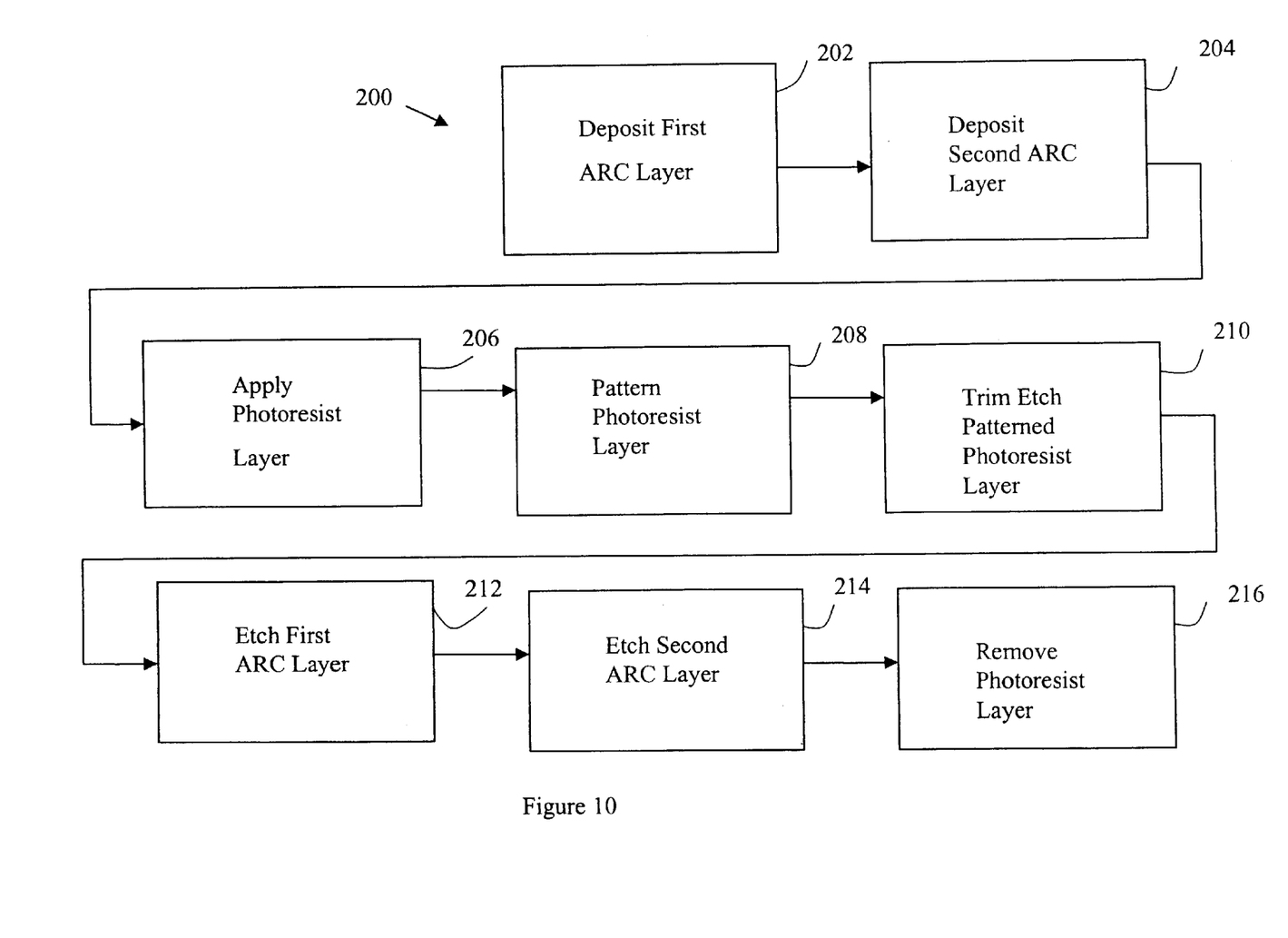
FIG. 10 is flow diagram showing a multilayer anti-reflective coating layer process of etching a substrate or a layer above a substrate.

With reference to FIG. 10, flow diagram 200 describes a process for forming a hard mask utilizing structure 14 (FIG. 1). At a step 202, a first anti-reflective coating (ARC) layer, such as layer 19 is deposited above a substrate. At a step 204, a second ARC layer is deposited above the first ARC layer. The second ARC layer can be a layer such as layer 21 (FIG. 3). As discussed above, the materials and thickness of the first and second ARC layers are chosen to have superior optical properties and yet operate as a hard mask.

At a step 206, a photoresist layer is applied over the second ARC layer. The photoresist layer can be photoresist material 16 (FIG. 1). At a step 208, the photoresist layer is patterned in a lithographic system such as system 10. At a step 210, the photoresist layer is trim etched to form a feature such as feature 62 (FIG. 8) having a smaller critical dimension. At a step 212, the first ARC layer is etched. At a step 214, the second ARC layer is etched. At a step 216, the photoresist layer is removed. The first and second ARC layers can be utilized as the hard mask for forming integrated circuit structures such as gate stacks.

It is understood that while the detailed drawings, specific examples, material types, thicknesses, dimensions, and particular values given provide a preferred exemplary embodiment of the present invention, the preferred exemplary embodiment is for the purpose of illustration only. The method and apparatus of the invention is not limited to the precise details and conditions disclosed. For example, although specific types of ARC materials and thicknesses processes are mentioned, other materials and process steps can be utilized. Various changes may be made to the details disclosed without departing from the spirit of the invention which is defined by the following claims.

What is claimed is:

1. A method of fabricating an integrated circuit, the method comprising:

providing a first anti-reflective coating layer above a substrate;

providing a second anti-reflective coating layer above the first anti-reflective coating layer;

providing a photoresist layer above the second anti-reflective coating layer;

patterning the photoresist layer, wherein a first thickness of the first anti-reflective coating layer and a second thickness of the second anti-reflective coating layer are configured to reduce reflections associated with the patterning step;

removing the first anti-reflective coating layer and the second anti-reflective coating layer in accordance with a feature defined by the photoresist layer.

2. The method of claim 1, further comprising:
etching a polysilicon layer above the substrate in accordance with the first anti-reflective coating layer and the second anti-reflective coating layer.

3. The method of claim 2, further comprising stripping the photoresist layer before the etching step.

4. The method of claim 3, wherein the first thickness and the second thickness are thick enough to withstand the etching step.

5. The method of claim 4, wherein the first thickness is 100–1000 Å and the second thickness is 100–1000 Å.

6. The method of claim 5, wherein the first anti-reflective coating layer and the second anti-reflective coating layer include at least one of CVD organic carbon.

7. The method of claim 6, wherein the first anti-reflective coating layer is CVD deposited carbon and the second anti-reflective coating layer is CVD deposited silicon rich nitride.

8. The method of claim 7, wherein the first thickness is less than 1000 Å thick and more than 100 Å.

9. The method of claim 1, further comprising trim etching the photoresist layer to define the feature.

10. A method of forming a gate stack for an integrated circuit, the method comprising:
providing a first anti-reflective coating layer and a second anti-reflective coating layer over a gate conductor layer;
providing a photoresist layer over the second anti-reflective coating layer;
patterning the photoresist layer to form a first feature in the photoresist layer;
trim etching the photoresist layer to reduce size of the first feature, thereby forming a second feature;
removing the first anti-reflective coating layer and the second anti-reflective coating layer in accordance with the second feature; and
etching the gate conductor layer in accordance with the first anti-reflective coating layer and the second anti-reflective coating layer.

11. The method of claim 10, wherein the first anti-reflective coating layer has a thickness of 100–1000 Å.

12. The method of claim 11, wherein the second anti-reflective coating layer has a thickness of 100–500 Å.

13. The method of claim 12, wherein the first anti-reflective coating layer includes CVD carbon.

14. The method of claim 13, wherein the gate conductor layer is polysilicon.

15. The method of claim 13, wherein the photoresist layer is high contrast ARF, KRF or 1-line resist.

16. A method of forming a hard mask for an integrated circuit, the method comprising steps of:
providing a dual layer anti-reflective coating above a substrate;
providing a photoresist layer above the dual layer anti-reflective coating;
patterning the photoresist layer to form a feature; and
selectively removing the dual layer anti-reflective coating in accordance with the photoresist feature.

17. The method of claim 16, wherein the dual layer anti-reflective coating includes CVD organic carbon and silicon rich nitride.

18. The method of claim 16, wherein the dual layer anti-reflective coating has a thickness of more than 100 and less than 1000 Å.

19. The method of claim 16, further comprising a step of etching a layer above the substrate in accordance with the dual layer anti-reflective coating.

20. The method of claim 16, wherein the dual layer anti-reflective coating includes CVD carbon and CVD nitride.

* * * * *